(12) United States Patent
Hashim et al.

(10) Patent No.: US 9,383,281 B2
(45) Date of Patent: Jul. 5, 2016

(54) FUEL STORAGE SYSTEM AND METHOD FOR DETECTING A GAS PRESSURE THEREIN

(75) Inventors: Hasdi R. Hashim, Ann Arbor, MI (US); Shahid Ahmed Siddiqui, Northville, MI (US)

(73) Assignee: Ford Motor Company, Dearborn, MI (US)

( * ) Notice: Subject to any disclaimer, the term of this patent is extended or adjusted under 35 U.S.C. 154(b) by 1971 days.

(21) Appl. No.: 12/388,708

(22) Filed: Feb. 19, 2009

(65) Prior Publication Data

US 2010/0206887 A1    Aug. 19, 2010

(51) Int. Cl.
| | |
|---|---|
| *G01L 21/30* | (2006.01) |
| *G01L 9/00* | (2006.01) |
| *F17C 13/02* | (2006.01) |
| *G01M 3/18* | (2006.01) |
| *H02J 1/00* | (2006.01) |
| *G01R 1/00* | (2006.01) |

(52) U.S. Cl.
CPC .............. *G01L 9/0005* (2013.01); *F17C 13/025* (2013.01); *G01M 3/186* (2013.01); *F17C 2203/0604* (2013.01); *F17C 2203/066* (2013.01); *F17C 2203/0619* (2013.01); *F17C 2203/0663* (2013.01); *F17C 2205/0326* (2013.01); *F17C 2205/0391* (2013.01); *F17C 2221/012* (2013.01); *F17C 2223/0123* (2013.01); *F17C 2223/036* (2013.01); *F17C 2250/032* (2013.01); *F17C 2250/043* (2013.01); *F17C 2250/0439* (2013.01); *F17C 2250/0491* (2013.01); *F17C 2250/0495* (2013.01); *F17C 2270/0168* (2013.01); *G01R 1/00* (2013.01); *H01L 2221/00* (2013.01); *H02J 1/00* (2013.01); *Y02E 60/321* (2013.01)

(58) Field of Classification Search
CPC ............. H02J 1/00; G01R 1/00; H01L 21/00; H01L 2221/00; F15B 1/00; F15B 7/00; F15B 111/00
USPC .............. 324/460, 661; 73/862.626, 718, 724
See application file for complete search history.

(56) References Cited

U.S. PATENT DOCUMENTS

| | | | | |
|---|---|---|---|---|
| 2,290,508 | A * | 7/1942 | Usselman et al. | 361/295 |
| 4,262,532 | A | 4/1981 | Butler et al. | |
| 4,623,953 | A * | 11/1986 | Dakin | 361/315 |
| 4,729,245 | A * | 3/1988 | Hansman, Jr. | G01F 23/284 73/149 |
| 5,040,415 | A | 8/1991 | Barkhoudarian | |
| 5,231,880 | A | 8/1993 | Ward et al. | |
| 5,604,315 | A * | 2/1997 | Briefer et al. | 73/861.49 |
| 5,764,539 | A | 6/1998 | Rani | |
| 6,016,697 | A * | 1/2000 | McCulloch | G01F 23/266 73/304 C |
| 6,789,429 | B2 | 9/2004 | Pinto et al. | |
| 6,949,937 | B2 * | 9/2005 | Knoedgen | 324/658 |
| 7,100,432 | B2 | 9/2006 | Forster | |
| 7,958,789 | B2 * | 6/2011 | Hayakawa et al. | 73/862.626 |
| 2002/0083767 | A1 * | 7/2002 | Kemp | G01F 23/265 73/292 |
| 2004/0159158 | A1 * | 8/2004 | Forster | 73/718 |
| 2008/0184787 | A1 | 8/2008 | Coates | |
| 2008/0204047 | A1 * | 8/2008 | Wern et al. | 324/661 |

\* cited by examiner

*Primary Examiner* — Huy Q Phan
*Assistant Examiner* — Temilade Rhodes-Vivour
(74) *Attorney, Agent, or Firm* — Damian Porcari; Brooks Kushman P.C.

(57) ABSTRACT

A fuel storage system includes a storage vessel including a dielectric liner, a voltage sensor formed by a pair of plates disposed on opposing surfaces of the liner, and a controller configured to determine a gas pressure in the storage vessel based on voltages measured by the sensor.

17 Claims, 2 Drawing Sheets

FUEL STORAGE SYSTEM AND METHOD FOR DETECTING A GAS PRESSURE THEREIN

BACKGROUND

A capacitor is a passive electrical component that can store energy in an electric field between a pair of conductors. The process of storing energy in the capacitor is known as "charging," and involves electric charges of equal magnitude, but opposite polarity, building up on each conductor. A capacitor's ability to store charge is measured by its capacitance in units of farads.

Capacitors are often used in electric and electronic circuits as energy-storage devices. They can also be used to differentiate between high-frequency and low-frequency signals. Practical capacitors have series resistance, internal leakage of charge, series inductance and other non-ideal properties not found in a theoretical, ideal, capacitor.

Some capacitors include two conductive electrodes, or plates, separated by a dielectric, which prevents charge from moving directly between the plates. Charge may, however, move from one plate to the other through an external circuit, such as a battery connected between terminals of the plates. When any external connection is removed, the charge on the plates persists. The separated charges attract each other, and an electric field is present between the plates.

An example capacitor may include two wide, flat, parallel plates separated by a thin dielectric layer. Assuming the area of the plates, A, is much greater than their separation, d, the instantaneous electric field between the plates, E(t), is generally the same at any location away from the plate edges. If the instantaneous charge on a plate, −q(t), is spread evenly, then $$E(t) = q(t)/\epsilon A \quad (1)$$

where $\epsilon$ is the permittivity of the dielectric. The voltage, v(t), between the plates is given by $$v(t) = \int_o^d E(t)dz = q(t)d/\epsilon A \quad (2)$$

where z is a position between the plates.

A capacitor's ability to store charge is measured by its capacitance, C, which is the ratio of the amount of charge stored on each plate, q, to the voltage, v:

$$C = q/v \quad (3)$$

or, substituting (2) into (3):

$$C = \epsilon A/d. \quad (4)$$

In SI units, a capacitor has a capacitance of one farad when one coulomb of charge stored on each plate causes a voltage difference of one volt between its plates. Capacitance, however, is usually expressed in microfarads (μF), nanofarads (nF) or picofarads (pF). In general, capacitance is greater in devices with large plate areas, separated by small distances. When a dielectric is present between two charged plates, its molecules become polarized and reduce the internal electric field and hence the voltage. This allows the capacitor to store more charge for a given voltage: a dielectric increases the capacitance of a capacitor by an amount proportional to the dielectric constant of the material.

SUMMARY

A fuel storage system may include a storage vessel including a dielectric liner, a voltage sensor formed by a pair of plates disposed on opposing surfaces of the liner, and a controller configured to determine a gas pressure in the storage vessel based on voltages measured by the sensor.

A fuel storage system may include a storage vessel including a dielectric liner, a first sensor formed by a first pair of plates disposed on opposing surfaces of the liner, and a second sensor formed by (i) a second pair of plates disposed on opposing surfaces of the liner and (ii) a thermistor disposed within the storage vessel and electrically connected with one of the second pair of plates. The system may also include a controller configured to determine a gas temperature in the storage vessel based on respective voltages across the first and second sensors.

A method for detecting a gas pressure within a storage vessel having a dielectric liner may include measuring a voltage over time across a sensor formed by a pair of metal plates disposed on opposing surfaces of the liner, and determining a gas pressure within the storage vessel based on the measured voltage across the sensor.

While example embodiments in accordance with the invention are illustrated and disclosed, such disclosure should not be construed to limit the invention. It is anticipated that various modifications and alternative designs may be made without departing from the scope of the invention.

DETAILED DESCRIPTION

Figure 1:
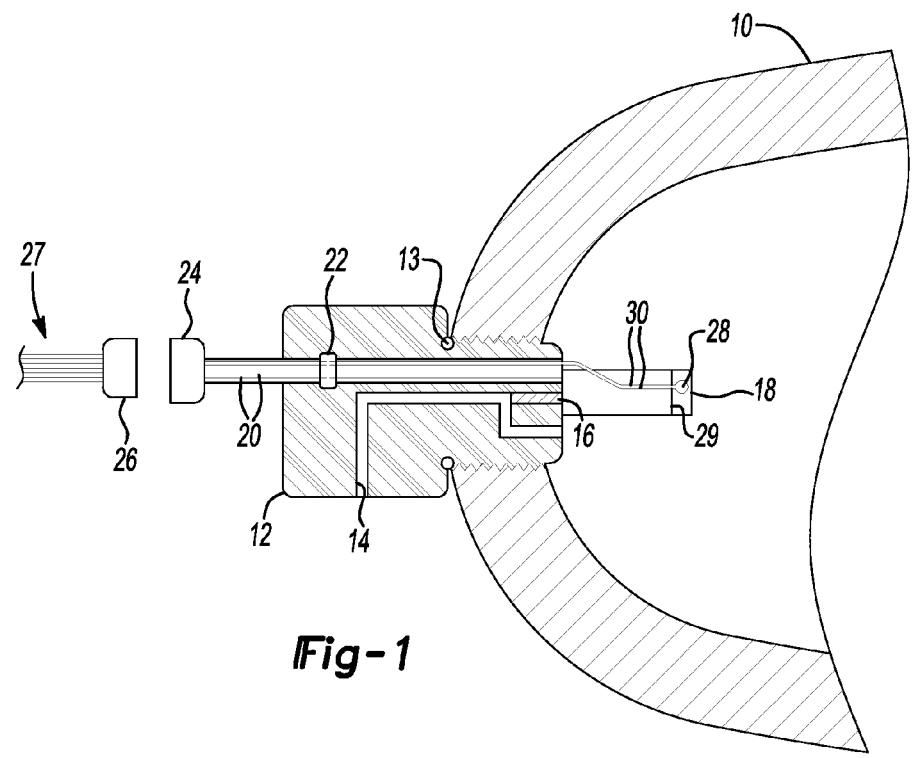
FIG. 1 is a side view, in cross-section, of an example fuel storage system.

Referring now to FIG. 1, an automotive fuel storage system includes a pressurized tank 10 and a valve 12 threadedly engaged with the tank 10. The valve 12 provides a passageway 14 for hydrogen gas to be provided to the tank 10. An O-ring 13 provides a seal between the valve 12 and the tank 10.

A moveable element 16, e.g., plunger, of a solenoid 18 may be positioned by the solenoid 18 to restrict or block the flow of hydrogen gas through the passageway 14. As illustrated in FIG. 1, the moveable element 16 is in the open position, thus allowing hydrogen to flow through the passageway 14. In the closed position (not shown), the moveable element 16 extends into the passageway 14.

The solenoid 18 receives control signals from a vehicle controller (not shown) via a pair of solenoid control wires 20. The solenoid control wires 20 pass through a pressure seal 22 and terminate at an electrical connector 24. The electrical connector 24 is attached with a mating electrical connector 26 of a wiring harness 27 electrically connected with the vehicle controller.

A temperature sensor 28 is disposed within the tank 10 and may be attached to the solenoid 18 via a tie-strap 29. The sensor 28 provides signals indicative of a temperature of the hydrogen within the tank 10 to the vehicle controller via a pair of sensor wires 30. The sensor wires 30 also pass through the seal 22 within the valve 12 and terminate at the electrical connector 24. A pressure sensor (not shown) may be similarly situated.

Figure 2:
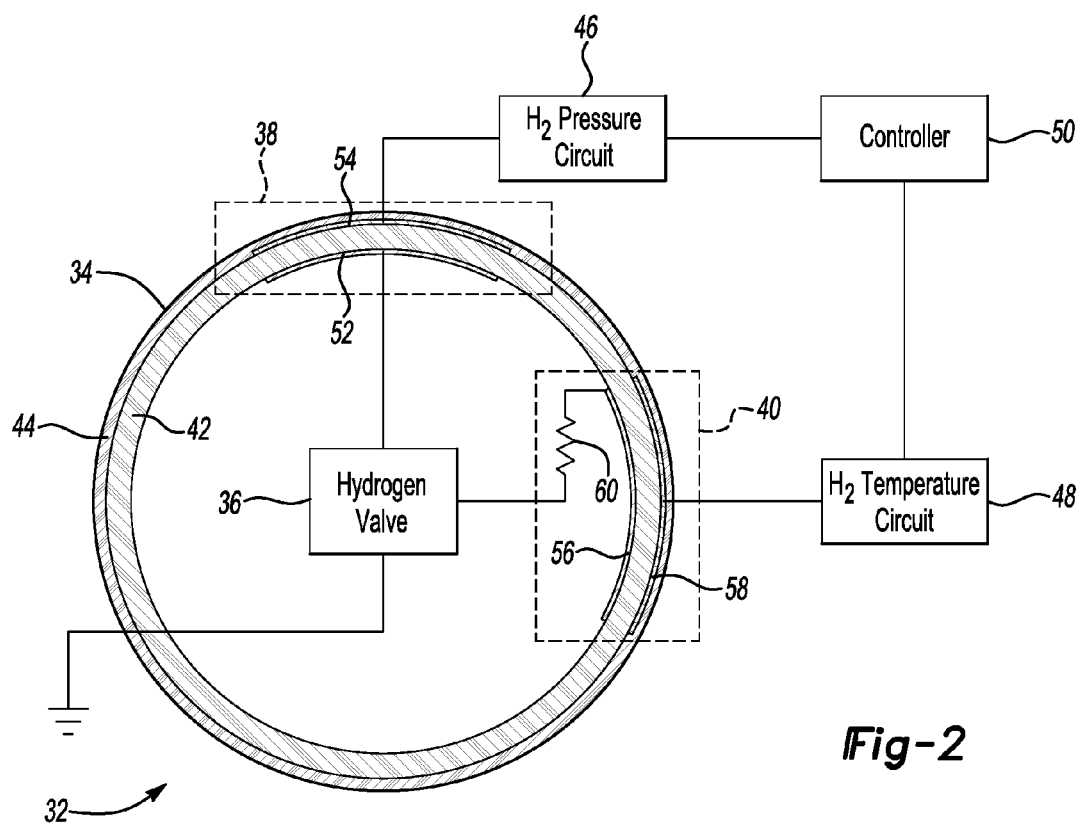
FIG. 2 is an end view, in cross-section, of another example fuel storage system.

Referring now to FIG. 2, an embodiment of a fuel storage system 32 includes a storage tank 34, valve 36, and sensors 38, 40. The valve 36 is electrically grounded (e.g., grounded to a chassis of a vehicle). The storage tank 34 of FIG. 2 includes a dielectric liner 42, e.g., high density polyethylene (HDPE), and a wrap 44, e.g., carbon fiber. As known to those of ordinary skill, the storage tank 34 may store hydrogen for use with an automotive fuel cell system. The storage system 32 also includes first and second circuits 46, 48 and a controller 50 in communication with the circuits 46, 48. In other embodiments, the circuits 46, 48 may be integrated with the controller 50. Other configurations are also possible. The circuits 46, 48 and controller 50 will be discussed in more detail below.

The sensor 38 includes a pair of metal plates 52, 54 positioned on opposing sides of the liner 42. The plate 52 is grounded (e.g., grounded to the chassis of the vehicle) via the valve 36. The sensor 40 includes a pair of metal plates 56, 58 positioned on opposing sides of the liner 42 and a thermistor 60 electrically connected between the valve 36 and plate 56. The plate 56 is grounded (e.g., grounded to the chassis of the vehicle) via the thermistor 60 and valve 36. In the embodiment of FIG. 2, the metal plates 52, 54, 56, 58 are adhered with the liner 42. Any suitable attachment method, however, may be used.

As apparent to those of ordinary skill, the metal plates 52, 54 as well as the metal plates 56, 58 form capacitors. As explained below, the capacitance of sensor 38 may be used to determine the pressure in the storage tank 34, and the resistance of the thermistor 60 may be used to determine the temperature in the storage tank 34.

Figure 3:
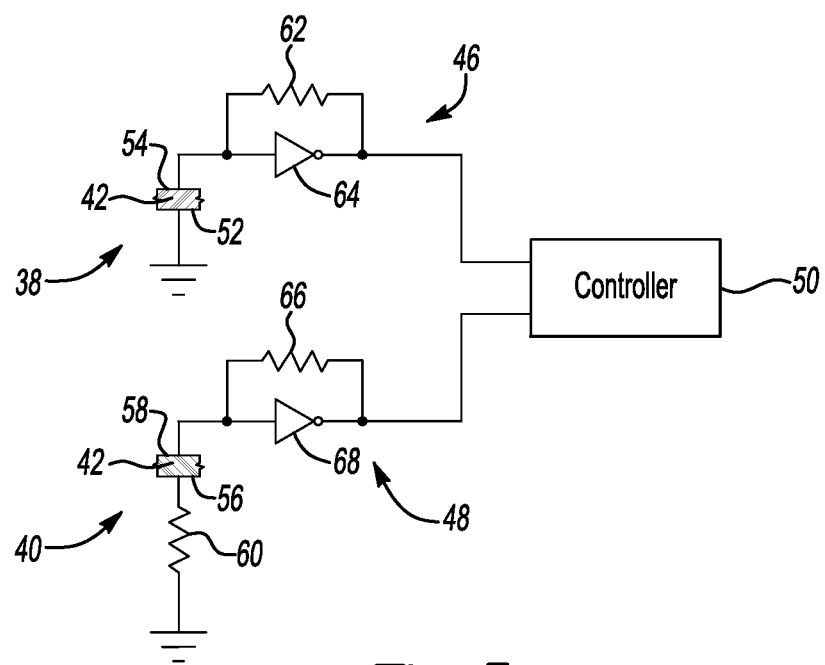
FIG. 3 is a schematic view of an embodiment of the fuel storage system of FIG. 2.

Referring now to FIG. 3, the first circuit 46 may include a resistor 62 (having a known resistance) and an inverting Schmitt trigger 64. Of course, any suitable circuit configuration, e.g., Op-amp, voltage comparator, analog digital converter, etc., may be used. As apparent to those of ordinary skill, the sensor 38 and resistor 62 form an RC circuit.

Initially, the output of the trigger 64 applies a HIGH step response to this RC circuit while the input of the trigger 64 senses the voltage across the sensor 38. Once the voltage rises above the 'upper' threshold of the trigger 64, the output of the trigger 64 will apply a LOW step response. Once the voltage falls below the 'lower' threshold, the output is HIGH again. The periodic signal generated by this circuit is detected by the controller 50 to determine the capacitance, $C_{38}$, of the sensor 38.

As known to those of ordinary skill, the step response of the above RC circuit is related to the resistance, $R_{62}$, of the resistor 62 and the capacitance, $C_{38}$, of the sensor 38. Assuming, for example, a HIGH step response of 5 Volts, the voltage across the sensor 40 over time, t, is give by:

$$v_{38}(t) = 5 \cdot (1 - e^{-t/R_{62}C_{38}}) \quad (5)$$

The time constant, $\tau_1$, derived from this step response is the time for the voltage across the sensor 38 to reach approximately 63% of its final (asymptotic) value:

$$\tau_1 = R_{62}C_{38} \quad (6)$$

The period detected by the controller 50 is proportional to this time constant, $\tau_1$. The controller 50 may thus find the capacitance, $C_{38}$, of the sensor 38 as it is the only unknown. (The capacitance will increase as the pressure within the tank 34 increases.)

From (4), the capacitance, $C_{38}$, of the sensor 38 is related to the area, $A_{38}$, of the plates 52, 54 in contact with the liner 42 and the thickness, $t_{42}$, of the liner 42:

$$C_{38} = \epsilon A_{38}/t_{42} \quad (7)$$

where $\epsilon$ is the permittivity of the liner 42. The controller 50 may thus find the thickness, $t_{42}$, of the liner 42 between the plates 52, 54 as it is the only unknown.

The controller 50 may then apply known analytical techniques or access a look-up table (generated, for example, via testing or simulation) relating the thickness of the liner 42 to the pressure within the storage tank 34 to find the pressure within the storage tank 34.

The second circuit 48 may include a resistor 66 (having a known resistance) and an inverting Schmitt trigger 68. Of course, any suitable circuit configuration may be used. Similar to the sensor 38, the sensor 40 and resistor 66 form another RC circuit.

The periodic signal generated by this circuit may be detected by the controller 50 to determine the resistance, $R_{60}$, of the thermistor 60. This period, however, is also affected by the capacitance, $C_{40}$, of the sensor 40. By constructing sensor 38 and sensor 40 such that their capacitance is generally the same (e.g. the plates 52, 54 and 56, 58 are of approximate equal size), the differences in the step response of the first RC circuit (formed by sensor 38 and resistor 62) and the step response of the second RC circuit (formed by the sensor 40 and the resistor 66) may thus be used to determine the temperature within the tank 34.

As known to those of ordinary skill, the step response of the second RC circuit is related to the resistance, $R_{66}$, of the resistor 66, the capacitance, $C_{40}$, of the sensor 40, and the resistance, $R_{60}$, of the thermistor 60 (part of sensor 40). Assuming, for example, a HIGH step response of 5 Volts, the voltage across sensor 40 over time, t, is given by:

$$v_{40}(t) = 5 \cdot \left(1 - \frac{R_{66}}{R_{66} + R_{60}} e^{-t/(R_{66}+R_{60})C_{40}}\right) \quad (8)$$

Assuming that $R_{60} \leq R_{66}$, the time constant, $\tau_2$, derived from this step response is the time for the voltage across the sensor 40 to reach approximately 63% of its final (asymptotic) value:

$$\tau_2 = [1 + 1n(R_{66}) - 1n(R_{66}+R_{60})](R_{66}+R_{60})C_{40} \quad (9)$$

The period detected by the controller 50 is proportional to this time constant, $\tau_2$. By assuming that the capacitance, $C_{40}$, of the sensor 40 is generally the same as the capacitance, $C_{38}$, of the sensor 38 (that is separately determined), the controller 50 may thus find the resistance, $R_{60}$, of the thermistor 60 as it is the only unknown. The controller 50 may then, for example, access a standard look-up table relating the resistance $R_{60}$ of the thermistor 60 to the temperature within the tank 60 to find the temperature within the tank 60.

As apparent to those of ordinary skill, sensor wires passing from inside the storage tank 34 to outside the storage tank 34 are not required (in contrast, for example, to the sensor wires 30 associated with the temperature sensor 28 illustrated in FIG. 1). As a result, the fuel storage system 32 may be less likely to leak relative to the fuel storage 10 illustrated in FIG. 1.

While embodiments of the invention have been illustrated and described, it is not intended that these embodiments illustrate and describe all possible forms of the invention. The words used in the specification are words of description rather than limitation, and it is understood that various changes may be made without departing from the spirit and scope of the invention.

What is claimed:
1. A fuel storage system comprising:
a storage vessel including a dielectric liner;

a voltage sensor formed by a pair of plates disposed on opposing surfaces of the liner; and a controller configured to determine a gas pressure in the storage vessel based on voltages measured by the sensor.

2. The system of claim 1 wherein the controller is further configured to determine a capacitance of the sensor based on the voltages measured by the sensor.

3. The system of claim 2 wherein the controller is further configured to determine a distance between the plates based on the capacitance of the sensor.

4. The system of claim 1 wherein one of the plates is electrically grounded.

5. The system of claim 1 wherein the plates are electrically conductive.

6. A fuel storage system comprising:

a storage vessel including a dielectric liner;

a first sensor formed by a first pair of plates disposed on opposing surfaces of the liner;

a second sensor formed by (i) a second pair of plates disposed on opposing surfaces of the liner and (ii) a thermistor disposed within the storage vessel and electrically connected with one of the second pair of plates; and a controller configured to determine a gas temperature in the storage vessel based on respective voltages across the first and second sensors.

7. The system of claim 6 wherein the controller is further configured to determine a capacitance of the first sensor based on the voltage across the first sensor.

8. The system of claim 7 wherein the controller is further configured to determine a distance between the first pair of plates based on the capacitance of the first sensor.

9. The system of claim 8 wherein the controller is further configured to determine a gas pressure within the storage vessel based on the distance between the first pair of plates.

10. The system of claim 6 wherein the controller is further configured to determine a resistance of the thermistor based on the voltage across the second sensor.

11. The system of claim 6 wherein one of the first pair of plates is electrically grounded.

12. The system of claim 6 wherein the one of the second pair of plates is electrically grounded via the thermistor.

13. The system of claim 6 wherein the first pair of plates are electrically conductive.

14. The system of claim 6 wherein the second pair of plates are electrically conductive.

15. A method for detecting a gas pressure within a storage vessel having a dielectric liner comprising:

measuring a voltage over time across a sensor formed by a pair of metal plates disposed on opposing surfaces of the liner; and determining a gas pressure within the storage vessel based on the measured voltage across the sensor.

16. The method of claim 15 wherein determining a gas pressure within the storage vessel based on the measured voltage across the sensor includes determining a capacitance of the sensor based on the measured voltage across the sensor.

17. The method of claim 16 wherein determining a gas pressure within the storage vessel based on the measured voltage across the sensor includes determining a thickness of the dielectric liner based on the capacitance of the sensor.

* * * * *